United States Patent
Sterzer et al.

(10) Patent No.: US 6,225,935 B1
(45) Date of Patent: May 1, 2001

(54) BIPHASE-ENCODED SIGNAL PROCESSING EMPLOYING PASSIVE AND/OR SEMI-PASSIVE TRANSISTOR CIRCUITS

(75) Inventors: Fred Sterzer, Lawrence Township, Mercer County; Daniel D. Mawhinney, Livingston, both of NJ (US)

(73) Assignee: MMTC, Inc., Princeton, NJ (US)

( * ) Notice: Subject to any disclaimer, the term of this patent is extended or adjusted under 35 U.S.C. 154(b) by 0 days.

(21) Appl. No.: 09/526,683

(22) Filed: Mar. 16, 2000

(51) Int. Cl.$^7$ ................................................ H03M 1/12
(52) U.S. Cl. ................................................ 341/155
(58) Field of Search ................................ 341/155, 133, 341/137, 162; 327/284, 101

(56) References Cited

U.S. PATENT DOCUMENTS

| | | | | |
|---|---|---|---|---|
| 4,866,441 | * | 9/1989 | Conway et al. | 341/122 |
| 5,381,147 | * | 1/1995 | Birkmayer | 341/137 |
| 6,008,748 | * | 12/1999 | Sterzer | 341/155 |

* cited by examiner

*Primary Examiner*—Brian Young
(74) *Attorney, Agent, or Firm*—George J. Selirsohn

(57) ABSTRACT

Disclosed are a plurality of different circuits employing a field effect transistor (FET), that preferably is a pseudomorphic high-electron-mobility transistor (PHEMT) that may be fabricated on a large-size monolithic chip, wherein the PHEMT is operated as a variable resistance in response to a first operating signal voltage applied to its gate and a second operating signal voltage having at least a first of two opposite polarities applied to its drain-source path, at least one of first and second operating signal voltages includes a multigigahertz frequency signal component having a certain phase; and the respective amplitudes of the first and second operating signal voltages are sufficiently low that the maximum power dissipation by the circuit is in the order of microwatts or less. The different circuits include (1) modulators and demodulators for converting between pulse-encoded binary data and biphase-encoded binary data that may be employed as chip input/output devices, (2) various microwave phase logic (MPL) devices, (3) a transmission gate and (4) a variable impedance device.

16 Claims, 9 Drawing Sheets

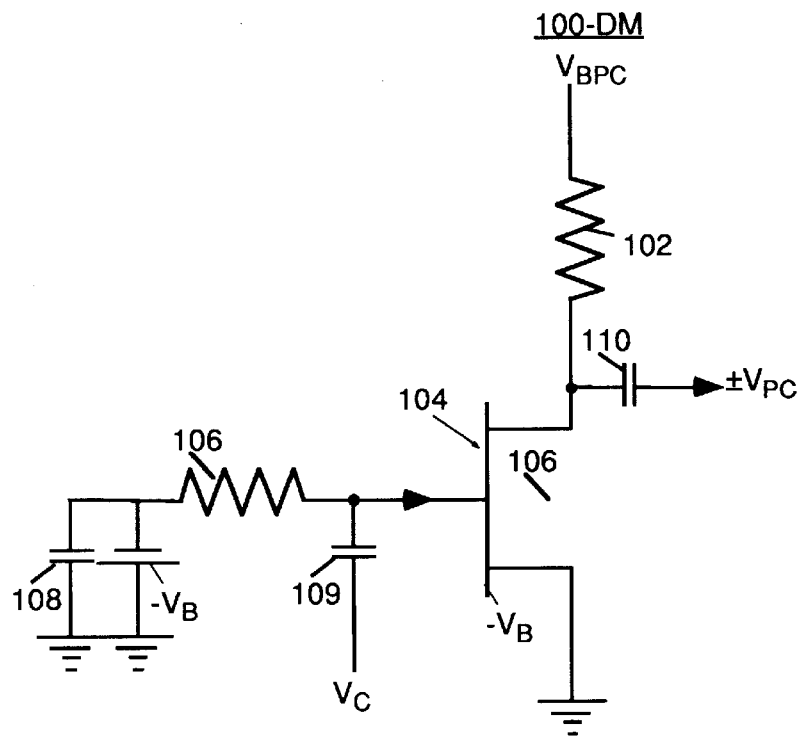
FIGURE 1c
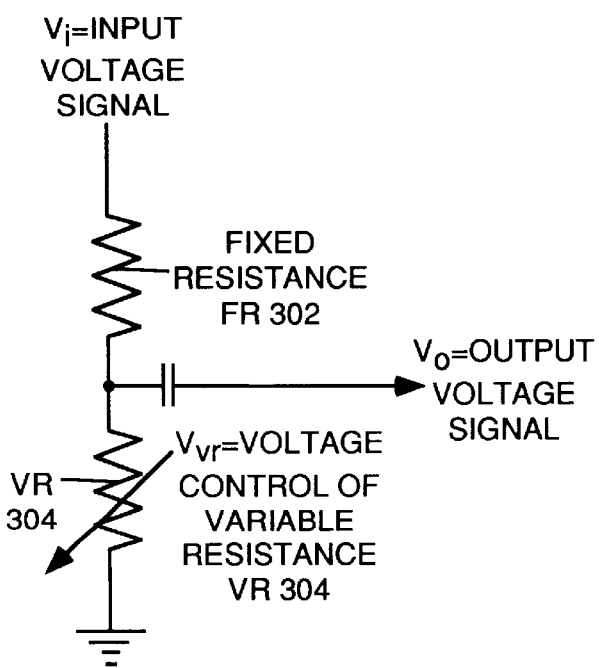
FIGURE 3
| $V_i$ | + | − | + | − |
|---|---|---|---|---|
| $V_{vr}$ | + | − | − | + |
| $V_o$ | − | − | + | + |
FIGURE 3a

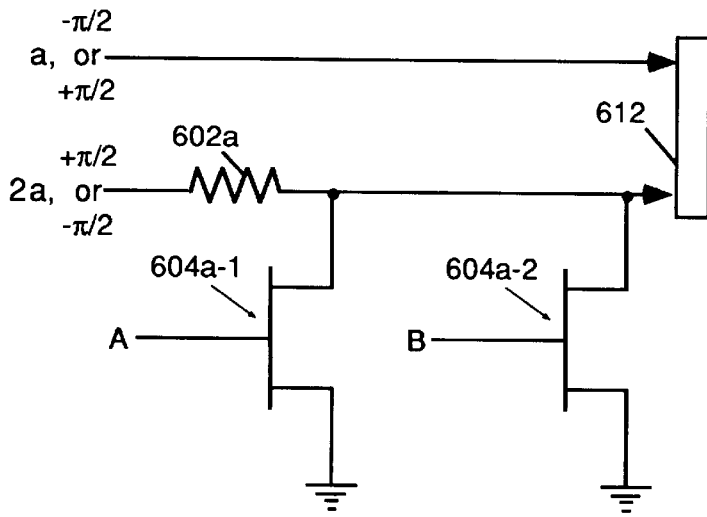
FIGURE 6a-1
FIGURE 6a-2
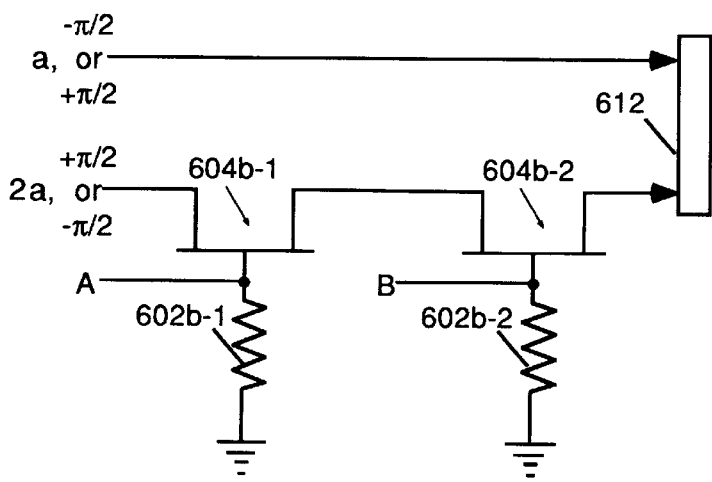
FIGURE 6b-1
FIGURE 6b-2

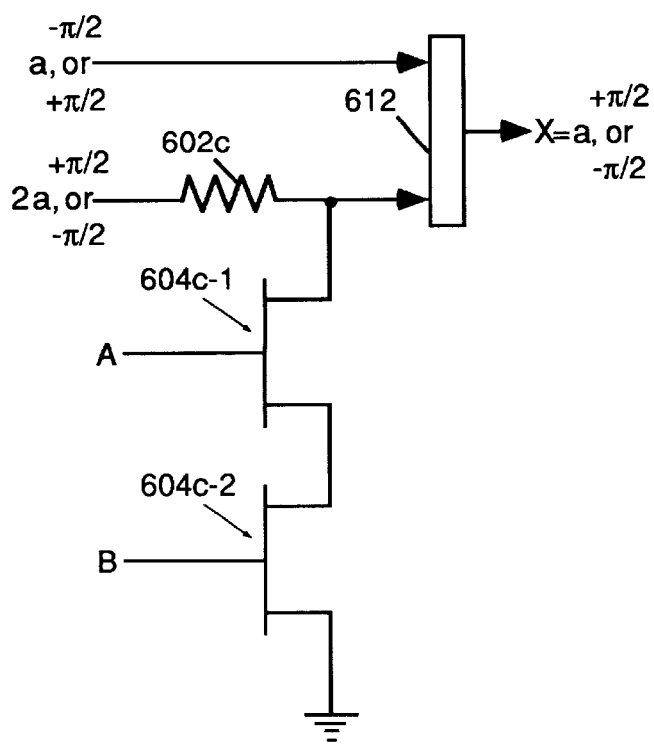
FIGURE 6c-1
FIGURE 6c-2
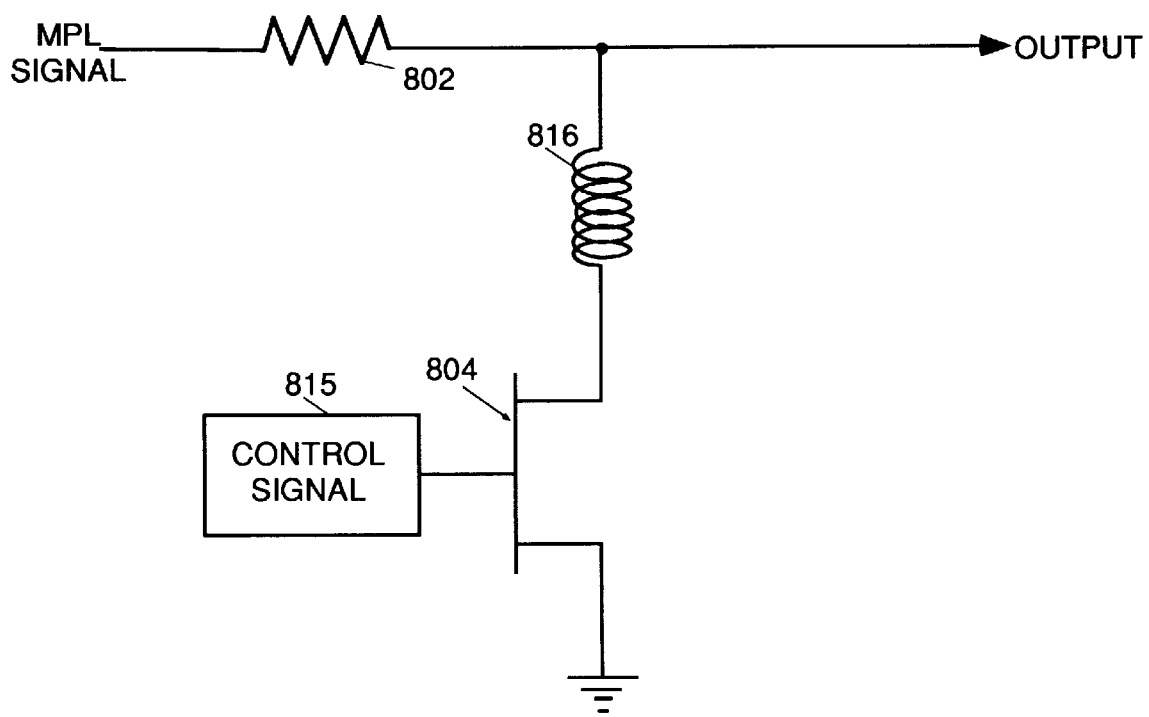
FIGURE 8

BIPHASE-ENCODED SIGNAL PROCESSING EMPLOYING PASSIVE AND/OR SEMI-PASSIVE TRANSISTOR CIRCUITS

This invention was made with Government support and the Government has certain rights to this invention.

BACKGROUND OF THE INVENTION

1. Field of the Invention

This invention relates to field-effect transistor (FET) circuits for providing a low-power, implementation of biphase signal processing suitable for such uses as microwave phase logic (MPL) and signal transmission for input to, output from and within large monolithic integrated-circuit (IC) chips and, more particularly, to passive and/or semi-passive FET circuits preferably employing pseudomorphic high-electron-mobility transistors (PHEMT) for microwave or very high frequency operation thereof.

2. Description of the Prior Art

Two different known ways of implementing digital encoding of information in binary form comprise pulse encoding and biphase encoding. In pulse encoding, which is often implemented by monolithic IC's performing digital processing, two switchable binary states are distinguished from on another by a sufficiently large minimum difference in voltage amplitude levels to prevent any ambiguity between them. In biphase encoding, which is often used for the wireless transmission of binary informational microwave frequencies, one of two binary states is represented by a predetermined frequency, fixed-amplitude signal having one certain phase (e.g., $+\pi/2$) and the other of two binary states is represented by the predetermined frequency fixed-amplitude signal having a phase (e.g., $-\pi/2$) opposite to the one certain phase.

Incorporated herein by reference are the teachings of U.S. Pat. Nos. 5,528,174 and its division 5,528,175, assigned to the assignee of the present application, which disclose various logic devices that employ biphase encoding for implementing microwave phase logic (MPL) operating at multigigabits per second rates. A first approach taught in these two patents, which may be implemented by a monolithic IC, employs multigate active FET circuits. However, a second approach taught in these two patents, which cannot be implemented by a monolithic IC, employs doubly-balanced mixers that can be operated, in some cases, as a modulator or, in other cases, as a demodulator. More specifically, as known, a doubly-balanced mixer employs a quad of 4 diodes connected in a ring together with an input balun and an output balun. Such baluns, operating at very high RF or microwave frequencies require transformers or other types of mutual coupling devices that are not amenable to implementation by a monolithic IC. Further, incorporated herein by reference is the teaching of U.S. Pat. No. 6,008,748, assigned to the assignee of the present application, which is directed to various MPL implementations of analog-to-digital (A/D) converters all of which employ such above-described doubly-balanced mixers that can be operated, in some cases, as a modulator or, in other cases, as a demodulator.

Recent advances in monolithic IC technology have made it possible to fabricate larger and larger chip-size ICs. Also, recent advances in microlithographic techniques make it practical to fabricate FETs with much smaller dimensions, thereby thereby permitting a large-size chip-IC to comprise a vast number (e.g., millions) of smaller-area individual FETs that are able to operate efficiently at substantially higher clock frequencies (where such clock frequencies may have a value of many hundreds of megahertz (MHz) or even of a multigigahertz microwave frequency). At such high clock frequencies, it is desirable to employ low characteristic impedance (e.g., 50 ohm) transmission lines to transmit digital signals from (1) an input device to an IC chip, (2) an output from one IC chip as an input to another IC chip and/or (3) an output from an IC chip to an output device. Further, because of the very large IC chip size, there may be a need to employ such a low characteristic impedance transmission line to transmit a digital signal derived at a first physical location on the IC chip to a second physical location on the IC chip which is relatively distant from the first physical location on the IC chip. In addition, very large IC chips tend to have a large number of individual inputs and output (I/O) ports. Each of these I/O ports must be properly impedance matched to the low-impedance transmission line with which it is associated and the power applied to each transmission line that is transmitted thereover must be at least sufficient to provide a signal-to-noise ratio high enough to provide substantially error-free data transmission.

Currently, each transmission line input tends to be powered by an individual driver responsive to pulse-encoded applied data, which driver has an output substantially matching the low (e.g., 50 ohm) characteristic impedance of the transmission line, while each transmission line output is terminated by a circuit having an input impedance substantially matching the low (e.g., 50 ohm) characteristic impedance of the transmission line. As pointed out above, pulse-encoded data requires a relatively large difference in voltage amplitude levels to prevent any ambiguity between binary states. Further switching between such binary states results in transients that increase noise, thereby increasing the power needed to be generated by each individual driver. Thus, if the low-impedance transmission line drivers are responsive to pulse-encoded data, the total power needed to be generated by all these drivers on a very-large monolithic chip cause undesirable high heating and high noise problems.

In biphase-encoded data, discussed above, wherein the phase of a fixed amplitude predetermined frequency signal may be either $+\pi/2$ or $-\pi/2$ in accordance with the current binary state of the data, inherently results in the generation of significantly lower switching noise (a higher signal-to-noise ratio) than is generated by pulse-encoded data. This is one reason that it is desirable in the case of a very large-size monolithic IC chip to employ drivers which generate biphase-encoding for transmitting very-high or microwave frequency data over the large number of low-impedance transmission lines associated with such a very large-size monolithic IC chip, even when the data to be digitally processed by this very large-size monolithic IC chip is to be implemented in pulse-encoded form.

One object of the present invention is to employ novel FET circuits to achieve significantly lower power biphase-encoded drivers and termination circuits for the large number of low-impedance transmission lines associated with such a very large-size monolithic IC chip than could be achieved using prior-art drivers and termination circuits.

Another object of the present invention is to employ novel FET circuits to achieve biphase-encoded MPL implemented on a monolithic IC chip.

While the FETs employed in the novel FET circuits of the present invention, described in detail below, may be FETs fabricated either of silicon or gallium arsenide, gallium-arsenide PHEMT FETs are preferable when operation is desired at a multigigahertz frequency, since, as known in the art, PHEMT FETs are particularly suitable for operation at multigigahertz frequencies.

SUMMARY OF THE INVENTION

Broadly, the present invention is directed to an improvement in a monolithic IC chip comprising a given circuit including an FET having a source, drain and gate, wherein the FET is operated as a variable resistance in response to a first operating signal voltage applied to its gate and a second operating signal voltage having at least a first of two opposite polarities applied to its drain-source path, wherein at least one of the first and second operating signal voltages includes a very high frequency or microwave frequency signal component having a certain phase and means is coupled to its drain-source for deriving an output signal voltage that includes the very high frequency or microwave frequency and has a phase determined solely by the polarity of the second operating signal voltage and an amplitude determined by the first operating signal voltage. Preferably, this FET is a PHEMT FET and the very high frequency or microwave frequency signal component is a multigigahertz frequency signal component that limits the maximum power dissipation of the given circuit to the order of microwatts or less.

BRIEF DESCRIPTION OF THE DRAWING

FIG. 1b are graphs of each of the respective signal voltages of FIG. 1a;

FIG. 1c shows a first demodulator circuit employing a passively-operated, monolithically-implemented FET as a variable resistance for demodulating a very high or microwave frequency biphase-encoded signal voltage to thereby derive a bipolar pulse-encoded output signal voltage to thereby derive a biphase-encoded output signal voltage;

FIG. 3 shows a generalized equivalent circuit of a passively-operated, monolithically-implemented FET employed as a variable resistance in which an input voltage signal is applied to a fixed resistance serially-connected to a variable resistance controlled by a voltage-control signal to thereby derive an output voltage signal, while FIG. 3a is a logic diagram relating the polarity of the output voltage signal of FIG. 3 to the respective polarities of the input voltage signal and the voltage-control signal of FIG. 3;

FIGS. 6a-1, 6b-1 and 6c-1, respectively, show NOR, AND and NAND MPL circuits, each of which employs two passively-operated, monolithically-implemented FETs as variable resistances, while FIGS. 6a-2, 6b-2 and 6c-2, respectively, show logic diagrams for these NOR, AND and NAND MPL circuits;

FIG. 8 shows an MPL circuit that incorporates an inductance coupled to a passively-operated, monolithically-implemented FET as a variable resistance for deriving an output signal voltage that depends, at least in part, on the effective reactance of said inductance.

DESCRIPTION OF THE PREFERRED EMBODIMENTS

Figure 1A:
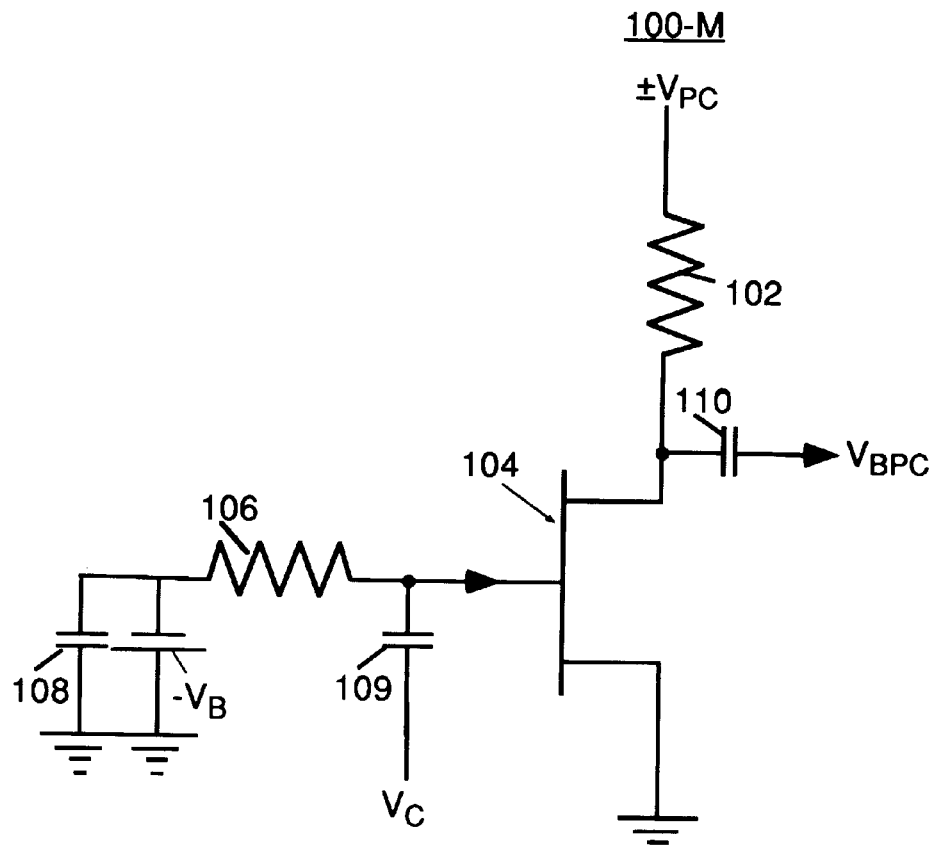
FIG. 1a shows a first modulator circuit employing a passively-operated, monolithically-implemented FET as a variable resistance for modulating a very high or microwave frequency reference carrier voltage signal with a bipolar pulse-encoded signal voltage to thereby derive a biphase-encoded output signal voltage.

Referring to FIG. 1a, there is shown an FET circuit operating as a modulator 100-M for use in converting a pulse-encoded binary digitized voltage $\pm V_{PC}$ into a biphase-encoded binary digitized voltage $V_{BPC}$. More specifically, pulse-encoded voltage $\pm V_{PC}$, which may vary in level between a given positive polarity level and a given negative polarity level (as graphically shown in FIG. 1b), is applied through serially-connected resistance 102 and the source-drain path of FET 104 to a point of reference potential (i.e., ground). A very high or microwave frequency reference carrier modulating signal $V_C$ (graphically shown in FIG. 1b) is applied through coupling capacitance 109 to the gate of FET 104, while a selected level of a negative DC bias voltage $-V_B$ is applied through resistance 106 to the gate of FET 104. Capacitance 108, connected across negative DC bias voltage $-V_B$, shunts reference carrier modulating signal $V_C$ to ground. The time-varying voltage level appearing at the junction of resistance 102 and the source-drain path of FET 104 is coupled through DC-blocking capacitance 110 as the biphase-encoded output voltage $V_{BPC}$ (graphically shown in FIG. 1b) of modulator 100-M).

The current level through serially-connected resistance 102 and the source-drain path of FET 104 increases during positive half-cycles of reference carrier modulating signal $V_C$ and decreases during negative half-cycles. Whenever $+V_{PC}$ has its positive polarity such increases result in the voltage both at the aforesaid junction and $V_{BPC}$ becoming more negative and such decreases result in the voltage both at the aforesaid junction and $V_{BPC}$ becoming more positive. However, whenever $\pm V_{PC}$ has its negative polarity such increases result in the voltage both at the aforesaid junction and $V_{BPC}$ becoming more positive and such decreases result in the voltage both at the aforesaid junction and $V_{BPC}$ becoming more negative. Operating in this manner, modulator 100-M is effective in converting pulse-encoded binary digitized voltage $+V_{PC}$ into a biphase-encoded binary digitized voltage $V_{BPC}$ (as illustrated in FIG. 1b).

Figure 1B:
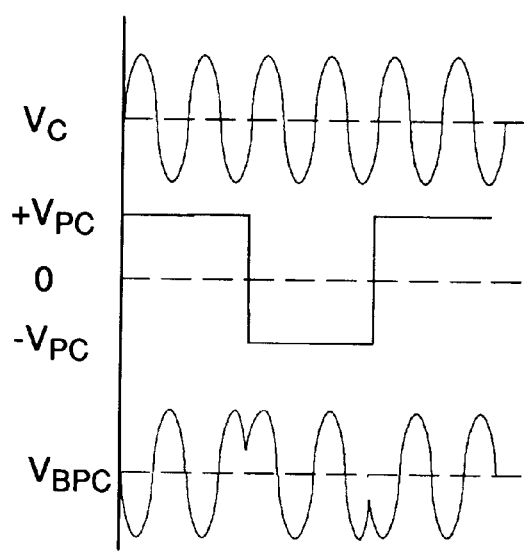

Referring now to FIG. 1c, there is shown an FET circuit operating as a demodulator 100-DM for use in converting a biphase5 encoded voltage $V_{BPC}$ (graphically shown in FIG. 1b) into a pulse-encoded binary digitized voltage $\pm V_{PC}$ (graphically shown in FIG. 1b).

In demodulator 100-DM, shown in FIG. 1c, $V_{BPC}$ is applied through serially-connected resistance 102 and the source-drain path of FET 104 to ground, while the time-varying voltage level appearing at the junction of resistance 102 and the source-drain path of FET 104 is coupled through DC-blocking capacitance 110 as the pulse-encoded binary digitized output voltage $+V_{PC}$ (graphically shown in FIG. 1b) of demodulator 100-DM). In all other respects, demodulator 100-DM, shown FIG. 1c, and modulator 100-M, shown in FIG. 1a, are structurally and functionally substantially identical to one another.

For operation at a multigigahertz carrier frequency (e.g., 13 GHz) modulated at a multigigabit rate (e.g., 4 Gigabit/second), FET 104 is best implemented in a monolithic IC comprising gallium arsenide (GaAs), rather than comprising silicon (Si) utilized for lower-frequency implementation of a monolithic IC incorporating FET 104. It is assumed, for illustrative purposes in describing the present invention, that FET 104 constitutes a PHEMT GaAs FET having a gate length of less than 0.2 $\mu$m, which permits a biphase-coded signal with a width of less than 100 picoseconds to be generated, as well as permitting it to operate as a limiter with a constant output and extremely fast phase reversal. Further, circuits comprising such a PHEMT GaAs FET require DC power only in the milliwatt or sub-milliwatt range.

FET 104, in both modulator 100-M of FIG. 1a and demodulator 100-DM of FIG. 1c, is operated without any DC voltage being applied to its source. Therefore, FET 104 operates passively as a variable resistance in series with fixed resistance 102 to form a voltage divider with the voltage level at the junction of these resistances being determined by the current value of the FET 104 variable resistance.

Figure 2:
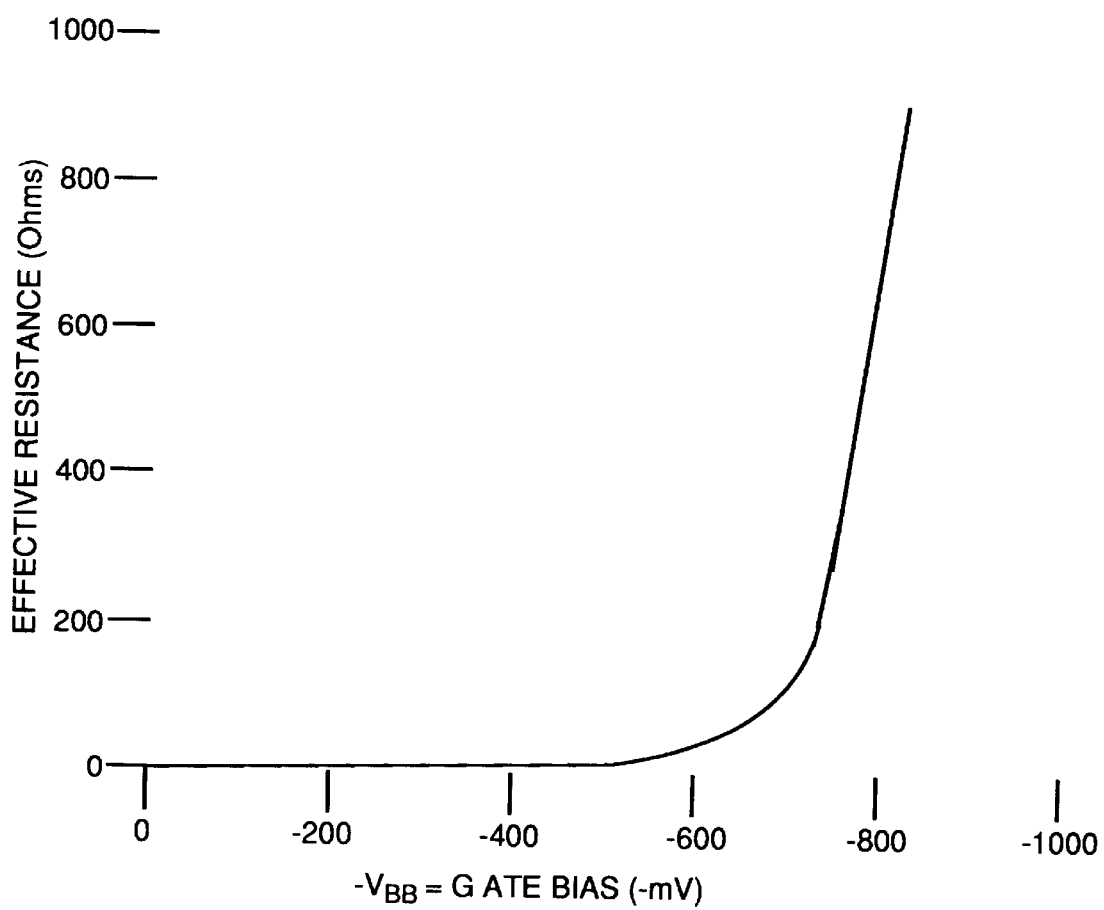
FIG. 2 is a graph showing the effective resistance of a PHEMT FET as a function of the value of a negative gate bias voltage applied thereto.

FIG. 2 is an experimentally derived graph showing the relationship of the effective resistance in ohms of a PHEMT GaAs FET (such as FET 104 of FIGS. 1a and 1c) as a function of a negative gate bias voltage (e.g., such as $-V_{BB}$ of FIGS. 1a and 1c) over a range from 0 to $-1,000$ millivolts (-mv).

Referring now to FIG. 3, there is shown a generalized equivalent circuit that includes the modulator 100 M FET circuit of FIG. 1a as a first structural example and the demodulator 100 DM FET circuit of FIG. 1c as a second structural example. In FIG. 3, fixed resistance FR 302 (corresponding to resistance 102 of FIGS. 1a and 1c) and variable resistance VR 304 (corresponding to FET 104 of FIGS. 1a and 1c) form a voltage divider for deriving a current voltage level appearing at the junction of fixed resistance FR 302 and variable resistance VR 304 (which is coupled through DC-blocking capacitance 310 as the current value of output voltage signal $V_O$) in accordance with the respective current value and polarity of the input voltage signal $V_i$ and the current value of variable resistance VR 304. A control voltage $V_{vr}$ of variable resistance VR 304 (corresponding to the sum of the value of negative bias voltage $-V_B$ and the current value and polarity of carrier voltage $V_C$) of FIGS. 1a and 1c) determines the current value of variable resistance VR 304.

FIG. 3a is a logic diagram for the case in which the current polarity of output voltage signal $V_O$ is made a function of the respective current polarities of input voltage signal $V_i$ and control voltage $V_{vr}$. Specifically, the current polarity of output voltage signal $V_O$ is negative if, and only if, the current polarities of $V_i$ and $V_{vr}$ are both positive or are both negative. Alternatively, the current polarity of output voltage signal $V_O$ is positive if, and only if, the current polarity of either one of $V_i$ and $V_{vr}$ is positive and the other of $V_i$ and $V_{vr}$ is negative. Thus, circuits corresponding to the generalized equivalent circuit shown in FIG. 3 (such as modulator 100-M and/or demodulator 100-DM, in particular) may be used to implement MPL in monolithic IC form.

The U.S. Pat. No. 5,528,174 discloses a plurality of different MPL circuits that employ modulators and/or demodulators that are not implemented in monolithic IC form. Instead, these MPL circuits disclosed in the aforesaid U.S. Pat. No. 5,528,174 employ doubly-balanced mixers for such purposes. Doubly-balanced mixers comprise two-terminal Schottky diodes (rather than the passive, variable resistance 3-terminal FET triodes employed by the present invention) and require baluns. Although it is possible to implement baluns in monolithic form, the wafer area required for a broadband balun is too large too large for practical large-scale integrated (LSI) circuits.

The advantages of using passive, variable resistance field effect transistors instead of Schottky diodes in high-speed, low-power monolithic MPL circuits can be summarized as follows:

a). Passive, variable resistance FETs are three-terminal devices with separate inputs and outputs. Schottky diodes, on the other hand, are two-terminal devices that require special circuits [such as baluns] to separate inputs from outputs. These additional circuits not only limit the bandwidth and therefore the speed of MPL Schottky diode circuits, but because of their relatively large size they also limit the number of MPL Schottky diode circuits that can fit on a wafer.

b.) Passive, variable resistance FETs can be fabricated using the same III-V epitaxy as active FETs. Low turn-on voltage Schottky diodes, on the other hand, require different III-V epitaxial layers than do high-speed transistors. This requirement complicates the fabrication of monolithic III-V MPL circuits containing Schottky diodes.

c.) The resistance of passive, variable resistance FETs is controlled by the voltage applied to their gates, and no control power is therefore needed to maintain the FETs in any given resistance state. In contrast, the resistance of Schottky diodes is controlled by the current flowing through them and power must be dissipated to keep the diodes in their ON state.

d.) MPL logic functions with very low power dissipation are simpler to implement with three-terminal FETs than with two-terminal Schottky diodes.

As discussed above, in the transmission of multigigabits/second digital signals from (1) an input device to an LSI chip, (2) an output from one LSI chip as an input to another LSI chip and/or (3) an output from an LSI chip to an output device, there are benefits to employ biphase-encoded digital signals transmitted over low characteristic impedance (e.g., 50 ohm) transmission lines, rather than employing pulse-encoded digital signals for these purposes.

More particularly, intercomputer networking requires an 1/0 structure that takes into account the transmission characteristics and loading effects of the interconnecting lines or wireless links that are used to tie the stations together. Ranging from simple direct wire connections through various telephone, wireless, or optical fiber links, specialized hardware and software are needed to implement established data transfer protocols. The distances between work stations often determine whether the simple wire connection or a more involved communication link is required. Within the individual work station, the lengths of interconnecting lines become significant fractions of the data rate wavelengths as data processing rates increase. The mismatches, reflections, and frequency-dependent impedance transformations that are an inherent consideration in high-frequency transmission lines impact the data transmission in often unpredictable ways if the lines are not matched. Since the characteristic impedances of most practical lines are less than the impedance of free-space, matching necessitates that the output elements drive low impedance lines and terminations which consumes power. The data transfer problems and determinations that are experienced in intercomputer networking begin to apply within the same work station and even on the same circuit board. Solutions to the serious problems associated with getting data on and off high-speed chips must include the consideration of "interchip networking"—looking at the data transfer between individual chips in a way that is analogous to "intercomputer networking". Various semiconductor technologies have been employed in 1/0 circuitry—each with specific advantages and disadvantages—and it is often the case that the output elements consume the majority of the input power since they must drive pin and line capacitances and transmit data over relatively low impedance lines. The typical power consumption of a conventional single-ended 1/0 buffer stage is about 40 mw. For multigigabits/second rates the power consumption approaches one watt. Since the power required to drive low impedance loads is proportional to the square of the applied voltage, lowering the required voltage levels has been a continuing goal of semiconductor device research. Lowering voltage is more effective than raising the impedance in that it saves power without increasing the RC constant that determines the frequency response. With pulse-encoded logic, the data voltage level (the difference between the two logic states) must be large enough to overcome inherent device variations, leakage, drift, and noise in the semiconductor devices with sufficient margin to provide error-free data transfer. Improved semiconductor technology has lowered the required voltage from earlier DTI and TTL levels and continuing development will undoubtedly provide further improvements, but it is unreasonable to expect that voltage levels can be reduced sufficiently to provide magnitudes of improvement.

This is one reason that biphase-encoded signals offer important advantages for ultra-high-speed interchip data transfers over low impedance lines to the input ports of digital processing circuits. Another reason is that for a given error rate, pulse-encoded digital signals require a 3 dB higher signal-to-noise (SNR) than do antipodal systems such as biphase-encoded digital signals. More particularly, inherent DC fluctuations in semiconductor devices produce a 1/f noise that dominates thermal noise at low frequencies. The signal levels required to obtain a given SNR in the voltage level of pulse-encoded signals are therefore greater than in biphase-encoded signals for the same SNR, since in biphase-encoding, unlike voltage levels in pulse-encoding, all frequencies of interest are above the frequency where the 1/f noise drops below the thermal noise floor.

By employing a passively-operated PHEMT FET consuming only microwatt or nanowatt signal power in modulator 100-M circuit, shown in FIG. 1a, and in demodulator 100-DM circuit, shown in FIG. 1c, makes it possible to transmit biphase-encoded multigigabit/second data over low impedance transmission lines at a signal power which is extremely low compared to that required for pulse-encoded transmission of such multigigabit/second data over low impedance transmission lines.

Figure 4A:
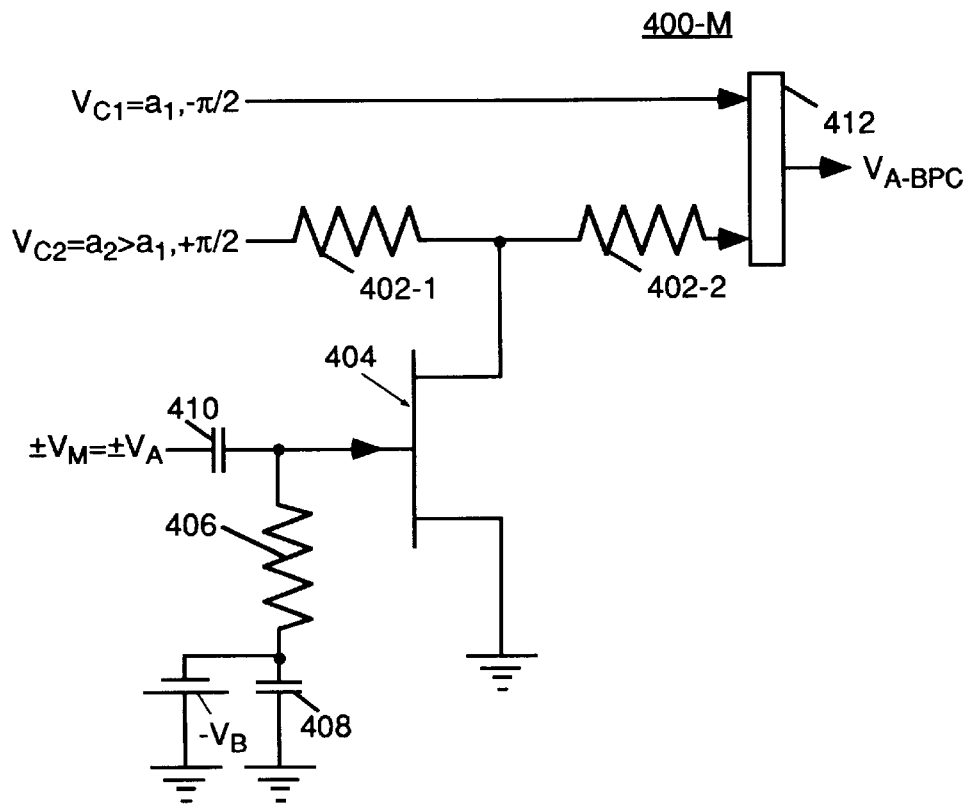
FIG. 4a shows a second modulator circuit employing a passively-operated, monolithically-implemented FET as a variable resistance for deriving a biphase-encoded output signal voltage having an amplitude value determined by the current amplitude value of an ongoing bipolar analog modulating signal voltage.
Figure 4B:
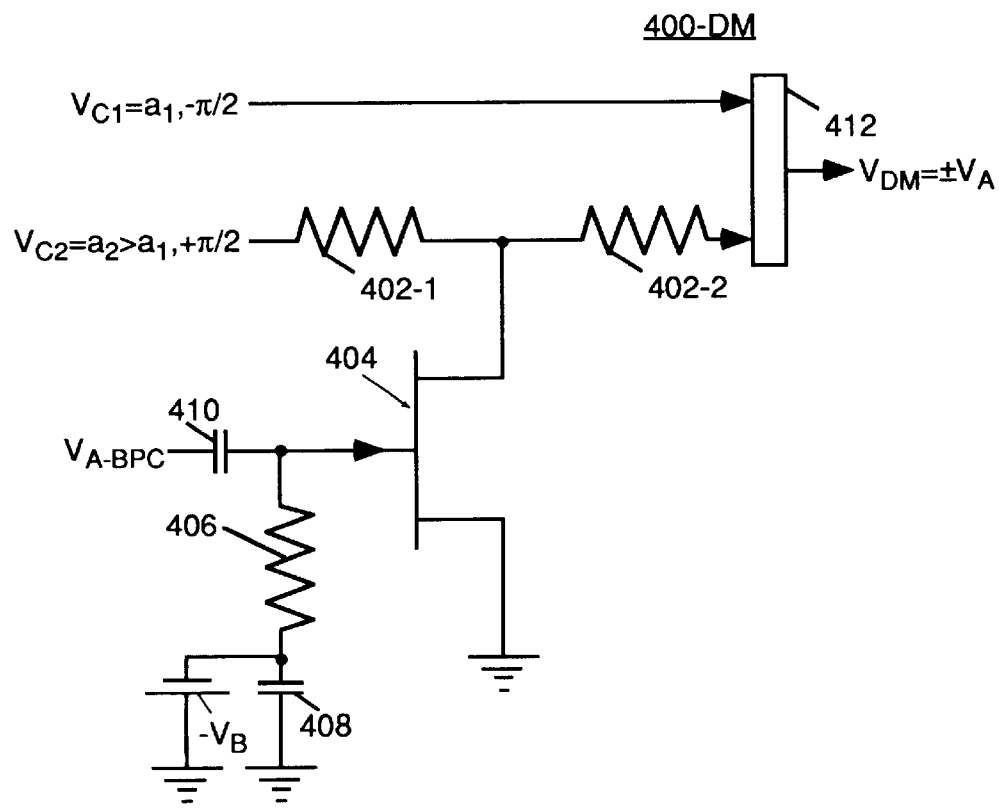
FIG. 4b shows a second demodulator circuit employing a passively-operated, monolithically-implemented FET as a variable resistance for deriving a bipolar analog output signal voltage having an amplitude value determined by the current amplitude value of an ongoing biphase-encoded input signal voltage.

The analog-to-digital converters taught in the aforesaid of U.S. Pat. No. 6,008,748 employ doubly-balanced MPL modulators for converting the current amplitude and polarity of an ongoing variable analog modulating voltage into a biphase-encoded voltage having an amplitude corresponding to that of the ongoing analog modulating voltage and a phase corresponding to the polarity of the ongoing analog modulating voltage. Also taught in the aforesaid of U.S. Pat. No. 6,008,748 are doubly-balanced MPL demodulators for converting a biphase-encoded voltage having an amplitude corresponding to that of an ongoing analog modulating voltage and a phase corresponding to the polarity of the ongoing analog modulating voltage back into the current amplitude and polarity of the ongoing analog modulating voltage. FIGS. 4a and 4b, respectively, show MPL modulator and demodulator circuits employing passively-operated FETs (preferably PHEMT FETs) which may be substituted for the doubly-balanced MPL modulators and demodulators of the analog-to-digital converters taught in the aforesaid of U.S. Pat. No. 6,008,748.

Shown in FIG. 4a is modulator 400-M circuit comprising resistances 402-1 and 402-2, passively-operated FET 404, resistance 406, negative DC bias voltage $-V_B$, bypass capacitance 408, coupling capacitance 410 and passive combiner 412. As indicated in FIG. 4a, a carrier voltage $V_{C1}$ having a first given amplitude $a_1$ and a phase $-\pi/2$ is applied directly to the top terminal of passive combiner 412 and a carrier voltage $V_{C2}$ having a second given amplitude $a_2$ larger than $a_1$ and a phase $+\pi/2$ is applied indirectly to the bottom terminal of passive combiner 412 through serially-connected resistances 402-1 and 402-2. The junction of serially-connected resistances 402-1 and 402-2 is connected to ground through the source-drain path of FET 404 and the gate of FET 404 is negatively biased by a given magnitude of $-V_B$ applied thereto through resistance 406. This given magnitude of $-V_B$ is preselected to produce an operating-point current magnitude through the source-drain path of FET 404 which results in the amplitude of the $+\pi/2$ carrier voltage reaching the bottom terminal of passive combiner 412 from the output of resistance 402-2 being just equal to the first given amplitude $a_1$ directly applied to the top terminal of passive combiner 412. A bipolar modulating voltage $\pm V_M$ having a current amplitude and polarity of a variable input analog voltage signal $\pm V_A$ is applied to the gate of FET 404 through coupling capacitance 410, while being bypassed to ground through resistance 406 and bypass capacitance 408. The output from passive combiner 412 is a biphase-encoded voltage $V_{A-BPC}$ having an amplitude corresponding to the current amplitude of the variable input analog voltage signal $\pm V_A$ and a phase corresponding to the current polarity of the variable input analog voltage signal $\pm V_A$.

Shown in FIG. 4b is demodulator 400-DM circuit that comprises the same circuit elements as above-described modulator 400-M circuit of FIG. 4a. Demodulator 400-DM differs from described modulator 400-M only in that biphase-encoded voltage $V_{A-BPC}$ (rather than analog voltage signal $\pm V_A$) is applied as the input to the gate of FET 404 through coupling capacitance 410, which results in the output from passive combiner 412 being a demodulated voltage signal $\pm V_{DM}$ having a value corresponding to the current amplitude and polarity of an analog signal $\pm V_A$.

In addition to the above-described modulator and demodulator circuits, there are many MPL circuits, described below, that are responsive to a multigigahertz frequency signal component having a certain phase and can be beneficially implemented employing passively-operated PHEMT FETs or, in some cases, semi-passively-operated PHEMT FETs, wherein the maximum power dissipation by any of the MPL circuits is in the order of microwatts. For purposes of the present invention, a semi-passively-operated PHEMT FET is defined as a PHEMT FET having a fixed voltage magnitude of a preselected polarity from a voltage source applied to the drain of the PHEMT FET, wherein the value of the source resistance of the voltage source is relatively insignificant compared to the value of the source-drain path of the PHEMT FET and the fixed voltage magnitude is insufficient to cause any significant amplification in the output from the PHEMT FET.

Figure 5:
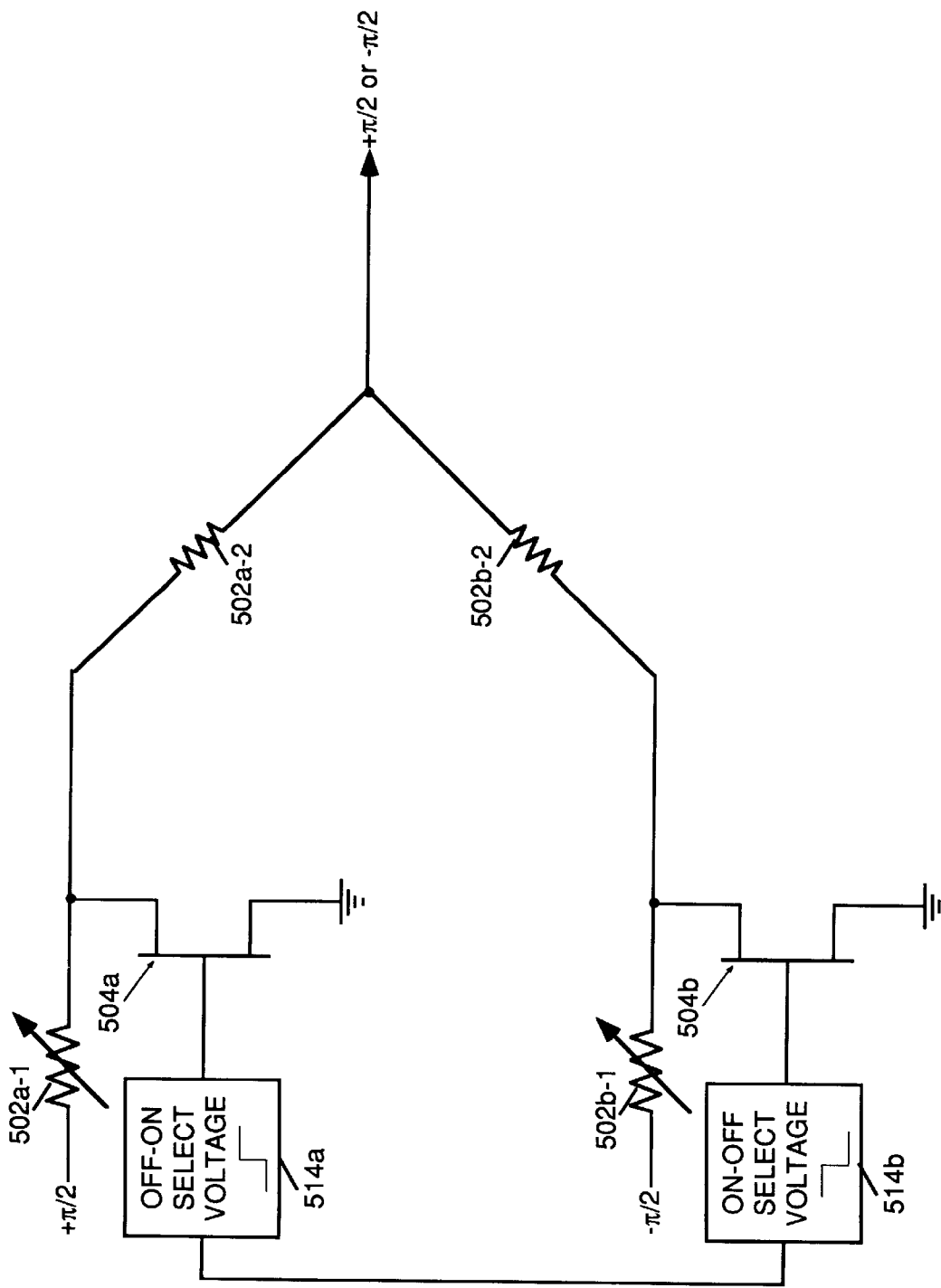
FIG. 5 shows a circuit suitable for MPL use that employs first and second passively-operated, monolithically-implemented FETs as variable resistances for deriving a selected one of either a $+\pi2$ signal voltage having a first settable amplitude level or a $-\pi2$ signal voltage having a second settable amplitude level.

Referring to FIG. 5, there is shown a given circuit composed of first and second sub-circuits. The first sub-circuit comprises a variable first resistance 502a-1 serially connected to a fixed second resistance 502a-2, and PHEMT FET 504a having its drain-source path connecting the junction of resistances 502a-1 and 502a-2 to a point of reference potential and an off-on select voltage from means 514a applied to its gate. The second sub-circuit comprises a variable first resistance 502b-1 serially connected to a fixed second resistance 502b-2, and PHEMT FET 504b having its drain-source path connecting the junction of resistances 502b-1 and 502b-2 to the point of reference potential and an on-off select voltage from means 514b applied to its gate. Means 514a and 514b are coupled to one another so that an off select voltage is applied to the gate of PHEMT FET 504a when an on select voltage is applied to the gate of PHEMT FET 504a when an off select voltage is applied to the gate of one of PHEMT FET 504b. The drain-source path of either of these of PHEMT FETs operates effectively as an open circuit in response to an off select voltage being applied to its gate and operates effectively as a short circuit to the point of reference potential in response to an on select voltage being applied to its gate. Thus, when the drain-source path of PHEMT FET 504a is being operated effectively as an open circuit and the drain-source path of PHEMT FET 504b is being effectively as a short circuit, a multigigahertz frequency signal component having a phase of $+\pi/2$ is forwarded by the first sub-circuit through serially-connected resistances 502a-1 and 502a-2 thereof as the output from the given circuit, with the amplitude of this $+\pi/2$ output being controlled in accordance with the setting of variable resistance 502a-1. Similarly, when the drain-source path of PHEMT FET 504b is being operated effectively as an open circuit and the drain-source path of PHEMT FET 504a is being effectively as a short circuit, a multigigahertz frequency signal component having a phase of $-\pi/2$ is forwarded by the second sub-circuit through serially-connected resistances 502a-1 and 502a-2 thereof as the output from the given circuit, with the amplitude of this $-\pi/2$ output being controlled in accordance with the setting of variable resistance 502b11.

FIGS. 6a-1, 6b-1 and 6c-1, respectively, are directed to NOR, AND and NAND MPL circuits (as indicated, respectively, by the logic diagrams of FIGS. 6a-2, 6b-2 and 6c-2) incorporating the present invention. As shown, each of these three MPL circuits comprises a passive combiner 612 that has a multigigahertz frequency binary signal component with a given amplitude a and a phase of either $-\pi/2$ or, alternatively, $+\pi/2$ applied directly to a top input terminal of passive combiner 612.

The NOR circuit shown in FIG. 6a-1 further comprises means for applying the multigigahertz frequency binary signal component with an amplitude 2a and a phase of either $+\pi/2$ or, alternatively, $-\pi/2$ (i.e., a phase opposite to the aforesaid phase applied directly to a top input terminal of passive combiner 612) applied to the bottom terminal of passive combiner 612 through resistance 602a. Further, the bottom terminal of passive combiner 612 is coupled to a point of reference potential through the drain-source path of each of PHEMPT FETs 604a-1 and 604a-2. A first pulse-encoded (i.e., baseband) logic input signal A is applied to the gate of PHEMPT FET 604a-1 and a second pulse-encoded logic input signal B is applied to the gate of PHEMPT FET 604a-2. When either logic input signal A or logic input signal B manifests a logic "0", it has an amplitude level that results in the drain-source path of the PHEMPT FET with which it is associated effectively operating as an open circuit. Alternatively, when either logic input signal A or logic input signal manifests a logic "1", it has an amplitude level that results in the drain-source path of the PHEMPT FET with which it is associated effectively operating as a short circuit to the point of reference potential. The output from passive combiner 612 is shown in FIG. 6a-1 for the "NOR" case, where both logic input signals A and B manifest a logic "0".

The AND circuit shown in FIG. 6b-1 further comprises means for applying the multigigahertz frequency binary signal component with an amplitude 2a and a phase of either $+\pi/2$ or, alternatively, $-\pi/2$ applied to the bottom terminal of passive combiner 612 through the serially5 connected drain-source paths of PHEMPT FETs 604b-1 and 604b-2. The first pulse-encoded logic input signal A is applied to the gate of PHEMPT FET 604b-1 through resistance 604b-1 and the second pulse-encoded logic input signal B is applied to the gate of PHEMPT FET 604a-2 through resistance 604b-2. Similar to the above-described "NOR" circuit case, when either logic input signal A or logic input signal B in the AND circuit case manifests a logic "0", it has an amplitude level that results in the drain-source path of the PHEMPT FET with which it is associated effectively operating as an open circuit. Alternatively, when either logic input signal A or logic input signal B AND circuit case manifests a logic "1", it has an amplitude level that results in the drain-source path of the PHEMPT FET with which it is associated effectively operating as a short circuit to the point of reference potential. The output from passive combiner 612 is shown in FIG. 6b-1 for the "AND" case, where both logic input signals A and B manifest a logic "1".

The NAND circuit shown in FIG. 6c-1 further comprises means for applying the multigigahertz frequency binary signal component with an amplitude 2a and a phase of either $+\pi/2$ or, alternatively, $-\pi/2$) applied to the bottom terminal of passive combiner 612 through resistance 602c. Further, the bottom terminal of passive combiner 612 is coupled to a point of reference potential through the drain-source paths of serially-connected PHEMPT FETs 604a-1 and 604a-2. The first pulse-encoded logic input signal A is applied to the gate of PHEMPT FET 604c-1 and the second pulse-encoded logic input signal B is applied to the gate of PHEMPT FET 604a-2. Similar to the above-described "NOR" circuit case, when either logic input signal A or logic input signal B in the NAND circuit case manifests a logic "0", it has an amplitude level that results in the drain-source path of the PHEMPT FET with which it is associated effectively operating as an open circuit. Alternatively, when either logic input signal A or logic input signal B AND circuit case manifests a logic "1", it has an amplitude level that results in the drain-source path of the PHEMPT FET with which it is associated effectively operating as a short circuit to the point of reference potential. The output from passive combiner 612 is shown in FIG. 6c-1 for the "NAND" case, where either one or both logic input signals A and B manifests a logic "0".

Logic input signals A and B in FIGS. 6a, 6b and 6c may initially be in pulse-encoded (i.e., baseband) form or, alternatively, they may have previously been in biphase-encoded form. In the latter case, a demodulator, such as shown in FIG. 4b, described above, may be employed to convert the biphase-encoded form to pulse-encoded form.

Further, the present invention contemplates the use of a transmission gate primarily for use as an input-output device on the chip for converting a pulse-encoded signal to a biphase-encoded signal. Employing only a single PHEMT FET in either FIG. 6a or FIG. 6c results in a shunt configuration for such a transmission gate being achieved, while employing only a single PHEMT FET in FIG. 6b results in a series configuration for such a transmission gate being achieved. Additional uses for such a transmission gate are in the implementation of multplexers and demultiplexers.

Figure 7A:
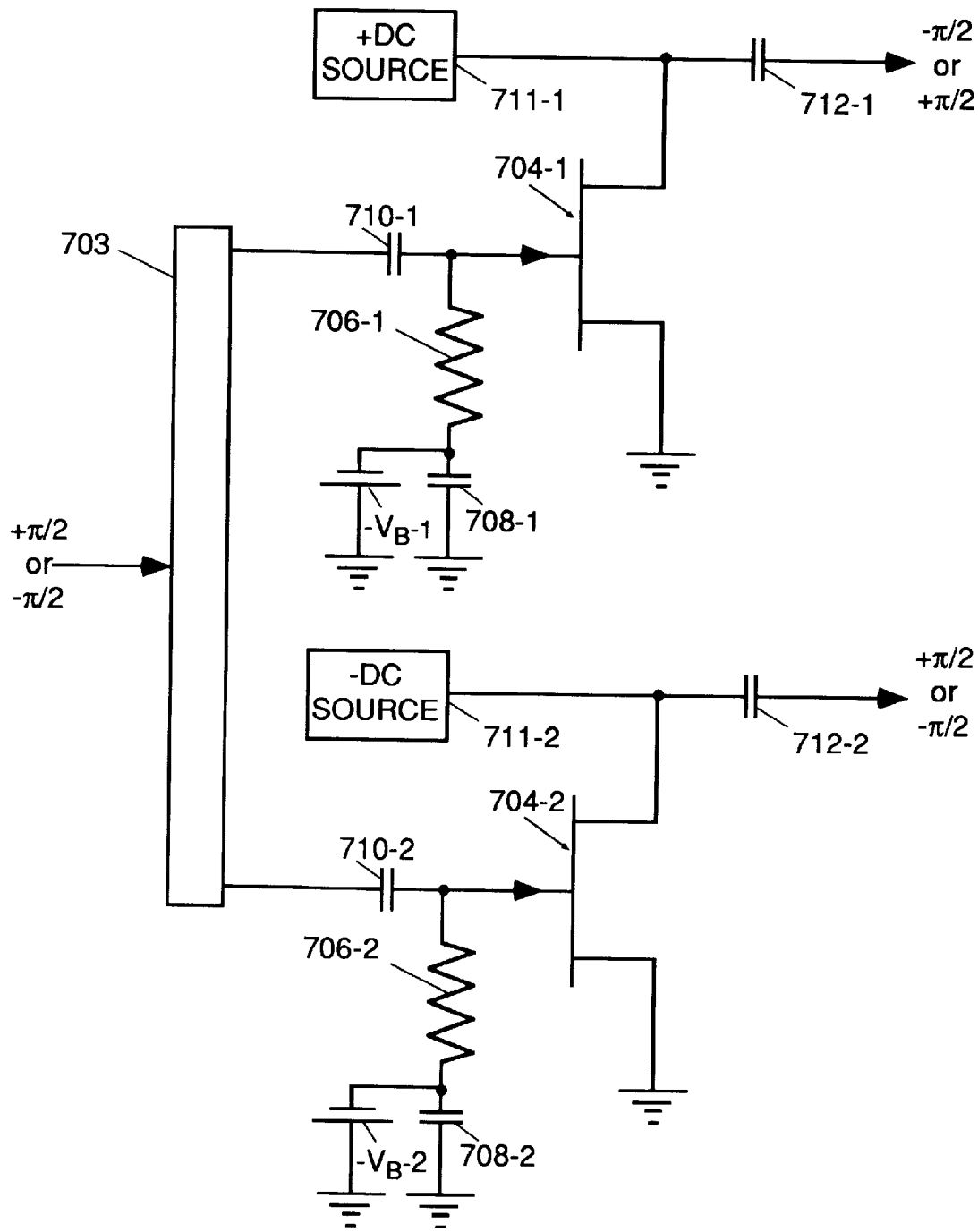
FIG. 7a shows an MPL unbalanced-to-balanced converter employing first and second sub-circuits, each of which employs a semi-passively-operated, monolithically-implemented FET as a variable resistance.

FIGS. 7a is directed to an unbalanced-to-balanced converter circuit incorporating the present invention which comprises (1) passive splitter 703 for splitting an unbalanced multigigahertz frequency operating signal component having a selected one of a $+\pi/2$ phase and a $-\pi/2$ phase applied as an input thereto into first and second balanced multigigahertz frequency signals as respective outputs therefrom, (2) a first sub-circuit responsive to the first balanced multigigahertz frequency signal applied thereto for deriving a multigigahertz frequency output signal component therefrom having a phase opposite to the phase of the first balanced multigigahertz frequency signal and (3) a second sub-circuit responsive to the second balanced multigigahertz frequency signal applied thereto for deriving a multigigahertz frequency output signal component therefrom having a phase the same as the phase of the second balanced multigigahertz frequency signal.

The first sub-circuit comprises +DC source 711-1 for coupling a positive polarity voltage therefrom through the variable resistance of the drain-source path of semi-passively-operated PHEMT FET 704-1 to a point of reference potential. The first balanced multigigahertz frequency signal is coupled as an input to the gate of PHEMT FET 704-1 by means that includes coupling capacitance 710-1, resistance 706-1 and negative bias voltage $-V_B$-1 bypassed by capacitance 708-1. The resulting multigigahertz frequency signal component across semi-passively-operated PHEMT FET 704-1 is forwarded through DC blocking capacitance 712-1 as the multigigahertz frequency output signal component from the first sub-circuit.

The second sub-circuit comprises -DC source 711-2 for coupling a negative polarity voltage therefrom through the variable resistance of the drain-source path of semi-passively-operated PHEMT FET 704-2 to a point of reference potential. The second balanced multigigahertz frequency signal is coupled as an input to the gate of PHEMT FET 704-2 by means that includes coupling capacitance 710-2, resistance 706-2 and negative bias voltage $-V_B$-2 bypassed by capacitance 708-2. The resulting multigigahertz frequency signal component across semi-passively-operated PHEMT FET 704-2 is forwarded through DC blocking capacitance 712-2 as the multigigahertz frequency output signal component from the second sub-circuit.

Figure 7B:
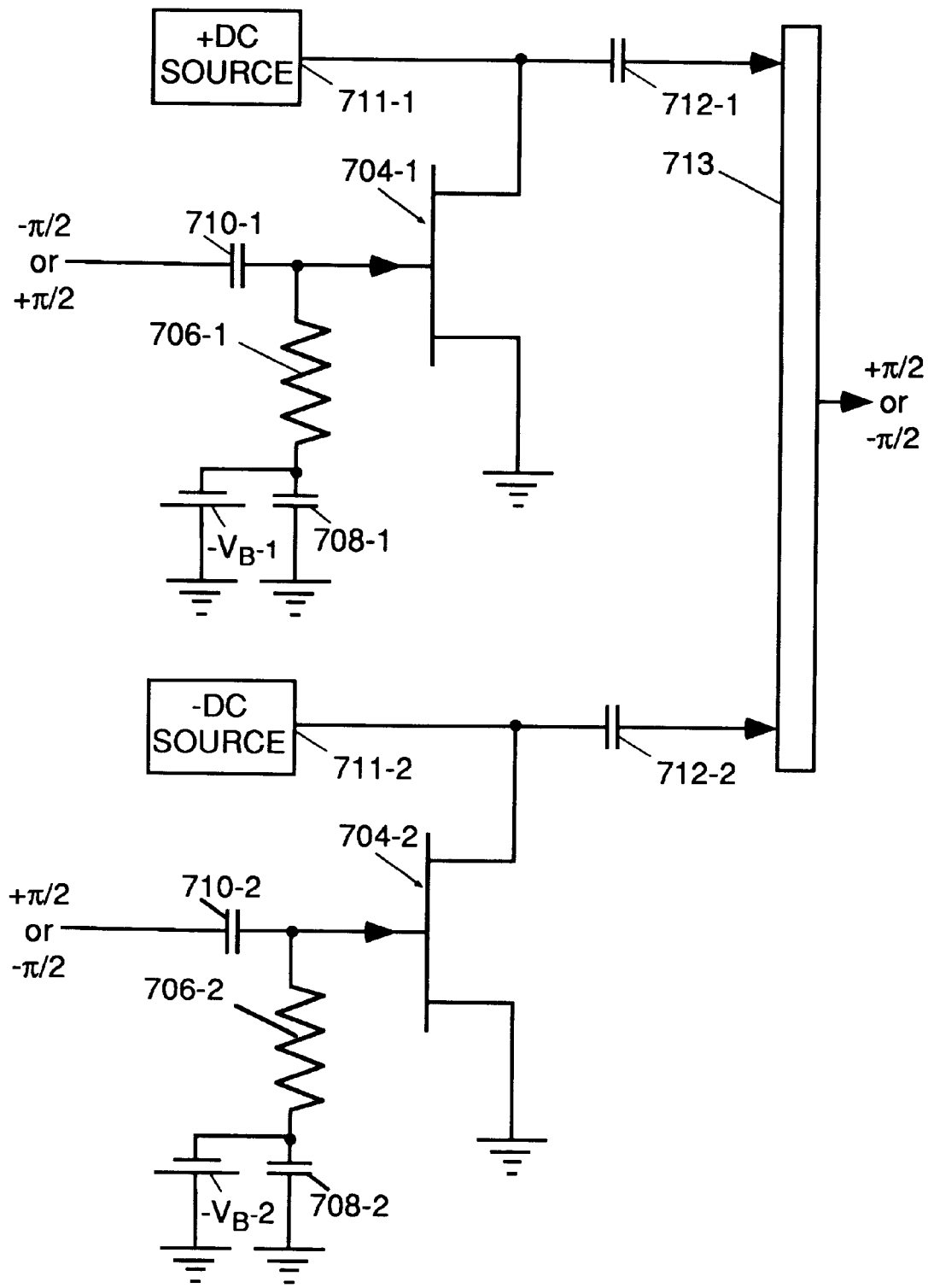
FIG. 7b shows an MPL balanced-to-unbalanced converter employing first and second sub-circuits, each of which employs a semi-passively-operated, monolithically-implemented FET as a variable resistance.

FIGS. 7b is directed to a balanced-to-unbalanced converter circuit incorporating the present invention which comprises (1) a first sub-circuit responsive to the first balanced multigigahertz frequency signal applied thereto having a selected one of a $-\pi/2$ phase and a $+\pi/2$ phase applied as an input thereto for deriving a first multigigahertz frequency output signal component therefrom having a phase opposite to the phase of the first balanced multigigahertz frequency signal and (2) a second sub-circuit responsive to the second balanced multigigahertz frequency signal applied thereto having a selected one of a $+\pi/2$ phase and a $-\pi/2$ phase applied as an input thereto for deriving a second multigigahertz frequency output signal component therefrom having a phase the same as the phase of the second balanced multigigahertz frequency signal and (3) passive combiner 713 for combining the first multigigahertz frequency output signal component derived by said first sub-circuit and the second multigigahertz frequency output signal component derived by said second sub-circuit to thereby provide a multigigahertz frequency signal component, having a selected one of a $+\pi/2$ phase and a $-\pi/2$ phase as the output from passive combiner 713.

As indicated by their respective reference numbers, each of the elements comprising the first sub-circuit of FIGS. 7b is identical to the corresponding above-described element comprising the first sub-circuit of FIGS. 7a. Similarly, as indicated by their respective reference numbers, each of the elements comprising the second sub-circuit of FIGS. 7b is identical to the corresponding above-described element comprising the second sub-circuit of FIGS. 7a.

The first sub-circuit of FIGS. 7a and 7b, may be employed by itself as a NOT logic circuit, since the phase of its multigigahertz frequency output signal component will be opposite to the phase of the multigigahertz frequency input signal component applied to the gate of its semi-passively-operated PHEMT FET 704-1. Further, the peak-to-peak amplitude phase of its multigigahertz frequency output signal component is set by the voltage level of +DC source 711-1. Also, a modification of this first sub-circuit which would make the polarity of the DC source selectable as either a +DC source or, alternatively, a -DC source would permit the modified first sub-circuit to operate as a phase selector circuit.

Reference is now made to FIG. 8, which is directed to a frequency-dependent given circuit of the present invention. As shown in FIG. 8, an MPL signal (such as a multigigahertz frequency input signal of a certain frequency and certain phase) is applied through a serially-connected network comprising resistance 802, inductance 816 and the drain-source path of passively-operated PHEMT FET 804 to a point of reference potential. The output of the given circuit is obtained at the junction of resistance 802 and inductance 816. Control signal means 815 applies a specified control voltage to the gate of PHEMT FET 804 to vary the conductivity of the drain-source path thereof in accordance with this control voltage. The specified control voltage may also have this certain frequency. However, the phase of the specified control voltage may, alternatively, be the certain phase, opposite to the certain phase, or displaced from the certain phase by some other given amount. In this manner, PHEMPT FET 804 may, alternatively, be operated as a variable impedance comprising a variable resistance, a variable reactance or a combination of variable reactance and resistance. Further, inductance 816 serially-connected to the drain-source path of PHEMPT FET 804 (including distributed capacitance associated therewith) may define a resonant circuit, which may be a series resonant circuit forming a short circuit of the output of the given circuit or a parallel resonant circuit forming an open circuit that permits the input MPL signal to be forwarded to the output of the given circuit.

The above-described given circuits are not intended to be exhaustive of all given circuits employing a passively-operated or semi-passively-operated PHEMT FET. For instance, a passively-operated PHEMT FET makes an excellent limiter (as can be discerned from the graph of FIG. 2 showing the effective resistance of a PHEMT FET as a function of the value of a negative gate bias voltage applied thereto). The first approach taught in the above-described of U.S. Pat. Nos. 5,528,174 and its division 5,528,175 employ multigate active FET circuits performing majority microwave phase logic. It is important that limiters be incorporated in such majority microwave phase logic circuits to insure that the logic voltage levels remain relatively constant throughout the system so that there is no ambiguity. The fact is that majority microwave phase logic circuits can be more efficiently implemented with a passively-operated PHEMT FETs. Further, it is within the skill of the art to fabricate multigate PHEMT FETs.

What is claimed is:

1. In a monolithic integrated-circuit (IC) chip comprising a given circuit including a field-effect transistor (FET) having a source, drain and gate, the improvement wherein:

said FET is operated as a variable resistance in response to a first operating signal voltage applied to said gate and a second operating signal voltage having at least a first of two opposite polarities applied to the drain-source path of said FET;

at least one of said first and second operating signal voltages includes a very high frequency or microwave frequency signal component having a certain phase; and means coupled to said drain-source path of said FET for deriving an output signal voltage that includes said very high frequency or microwave frequency and has a phase determined solely by the polarity of said second operating signal voltage and an amplitude determined by said first operating signal voltage.

2. The monolithic IC chip defined in claim 1, wherein said given circuit is a modulator that further includes:

means for deriving said first operating signal voltage comprises a negative bias voltage source $-V_B$ coupled to said gate of said FET through a first resistance and a given very high or microwave carrier-frequency $V_C$ coupled to said gate of said FET through a first capacitance;

means for deriving said second operating signal voltage comprises a bipolar pulse-encoded signal $\pm V_{PC}$ coupled to said drain-source path of said FET through a second resistance serially-connected to said drain-source path; and said means coupled to said drain-source path of said FET for deriving a biphase-encoded signal $V_{BPC}$ as said output signal voltage comprises a second capacitance coupled to the junction of said second resistance and said drain-source path of said FET.

3. The monolithic IC chip defined in claim 2, wherein:

said FET is a pseudomorphic high-electron-mobility transistor (PHEMT):

$V_C$ is a multigigahertz frequency signal having said certain phase;

and the respective amplitudes of $V_C$ and $\pm V_{PC}$ are sufficiently low that the maximum power dissipation by said modulator is in the order of microwatts or less.

4. The monolithic IC chip defined in claim 1, wherein said given circuit is a demodulator that further includes:

means for deriving said first operating signal voltage comprises a negative bias voltage source $-V_B$ coupled to said gate of said FET through a first resistance and a given very high or microwave carrier-frequency $V_C$ coupled to said gate of said FET through a first capacitance;

means for deriving said second operating signal voltage comprises a biphase-encoded signal $V_{BPC}$ coupled to said drain-source path of said FET through a second resistance serially-connected to said drain-source path; and said means coupled to said drain-source path of said FET for deriving a bipolar pulse-encoded signal $\pm V_{PC}$ as said output signal voltage comprises a second capacitance coupled to the junction of said second resistance and said drain-source path of said FET.

5. The monolithic IC chip defined in claim 4, wherein:

said FET is a pseudomorphic high-electron-mobility transistor (PHEMT):

$V_C$ is a multigigahertz frequency signal having said certain phase; and the respective amplitudes of $V_C$ and $V_{BPC}$ are sufficiently low that the maximum power dissipation by said demodulator is in the order of microwatts or less.

6. The monolithic IC chip defined in claim 1, wherein:

said FET is a pseudomorphic high-electron-mobility transistor (PHEMT);

at least one of said first and second operating signal voltages includes a multigigahertz frequency signal component having said certain phase; and the respective amplitudes of said first and second operating signal voltages being sufficiently low that the maximum power dissipation by said circuit is in the order of microwatts or less.

7. The monolithic IC chip defined in claim 6, wherein:

said given circuit is a given microwave phase logic (MPL) circuit in which said certain phase of said multigigahertz frequency signal component is a selected one of a relative $+\pi/2$ and $-\pi/2$ phase that corresponds to the binary state of a binary information signal.

8. The monolithic IC chip defined in claim 7, wherein said given MPL circuit is incorporated as a modulator in an analog-to-digital (A/D) converter, and said modulator comprises:

a passive combiner for combining first and second input signals applied thereto into a single output signal;

first means for directly applying said multigigahertz frequency signal component having a $-\pi/2$ phase and a first given amplitude $a_1$ as said first input to said passive combiner;

second means for applying said multigigahertz frequency signal component having a $+\pi/2$ phase and a second given amplitude $a_2$, where $a_2>a_1$, through first and second serially-connected resistances as said second input to said passive combiner;

third means for coupling the junction of said first and second serially-connected resistances to a point of reference potential through the variable resistance of said PHEMT FET; and fourth means for (1) applying a negative bias voltage $-V_B$ to the gate of said PHEMT FET having that value that, per se, results in the amplitude of said second input to second input to said passive combiner being substantially equal to $a_1$ and (2) applying the current amplitude value and polarity of an ongoing bipolar analog voltage $\pm V_A$ as the signal input to the gate of said PHEMT FET;

whereby said single output signal from said passive combiner is a biphase-encoded voltage signal $V_{A\text{-}BPC}$ having an amplitude corresponding to the current amplitude of $\pm V_A$ and a phase determined by the current polarity of $\pm V_A$.

9. The monolithic IC chip defined in claim 7, wherein said given MPL circuit is incorporated as a demodulator in an analog-to-digital (A/D) converter, and said demodulator comprises:

a passive combiner for combining first and second input signals applied thereto into a single output signal;

first means for directly applying said multigigahertz frequency signal component having a $-\pi/2$ phase and a first given amplitude $a_1$ as said first input to said passive combiner;

second means for applying said multigigahertz frequency signal component having a +π/2 phase and a second given amplitude $a_2$, where $a_2 > a_1$, through first and second serially-connected resistances as said second input to said passive combiner;

third means for coupling the junction of said first and second serially-connected resistances to a point of reference potential through the variable resistance of said PHEMT FET; and fourth means for (1) applying a negative bias voltage $-V_B$ to the gate of said PHEMT FET having that value that, per se, results in the amplitude of said second input to second input to said passive combiner being substantially equal to $a_1$ and (2) applying the current amplitude value and phase of an ongoing variable-amplitude, biphase-encoded voltage signal $V_{A\text{-}BPC}$ as the signal input to the gate of said PHEMT FET;

whereby said single output signal from said passive combiner is a bipolar analog voltage $\pm V_A$ having an amplitude corresponding to the current amplitude of $V_{A\text{-}BPC}$ and a polarity determined by the current phase of $V_{A\text{-}BPC}$.

10. The monolithic IC chip defined in claim 7, wherein said given circuit comprises:

a first sub-circuit comprising a first variable resistance serially connected to a first fixed resistance and a first PHEMT FET having a source, drain and gate with its drain-source path connecting the junction of said first variable resistance and first fixed resistance to a point of reference potential;

first means for applying said multigigahertz frequency signal component having a −π/2 phase as an input to said first variable resistance;

a second sub-circuit comprising a second variable resistance serially connected to a second fixed resistance and a second PHEMT FET having a source, drain and gate with its drain-source path connecting the junction of said second variable resistance and second fixed resistance to said point of reference potential;

second means for applying said multigigahertz frequency signal component having a −π/2 phase as an input to said second variable resistance;

control means for applying an "OFF-ON" select voltage to said gate of said first PHEMT FET and an "ON-OFF" select voltage to said gate of said second PHEMT FET to thereby operate a selected one of said first and second PHEMT FETs as a closed while operating the other of said first and second PHEMT FETs as an open switch; and output means for combining the output of said first sub-circuit occurring at the output of said first fixed resistance with the output of said second sub-circuit occurring at the output of said second fixed resistance.

11. The monolithic IC chip defined in claim 7, wherein said given circuit comprises:

first and second PHEMT FETs each of which has a source, drain and gate;

a given resistance having a given value;

first means for applying said multigigahertz frequency signal component having substantially twice a given amplitude and a selected one of a +π/2 phase and a −π/2 phase to a point of reference potential through said given resistance serially connected to the drain-source path of said first PHEMT FET and through said given resistance serially connected to the drain-source path of said second PHEMT FET;

second means for applying a first binary logic signal to said gate of said first PHEMT FET for effectively rendering a variable resistance value of said drain-source path thereof significantly less than said given value of said given resistance in response to said first binary logic signal having a first binary level representative of "0" and significantly more than said given value of said given resistance in response to said first binary logic signal having a second binary level representative of "1";

third means for applying a second binary logic signal to said gate of said second PHEMT FET for effectively rendering a variable resistance value of said drain-source path thereof significantly less than said given value of said given resistance in response to said second binary logic signal having a first binary level representative of "0" and significantly more than said given value of said given resistance in response to said second binary logic signal having a second binary level representative of "1"; and fourth means including a passive combiner for combining an output at the junction of said given resistance and the drain-source paths of said first and second PHEMT FETs with the multigigahertz frequency signal component having substantially said given amplitude and the non-selected one of a +π/2 phase and a −π/2 phase to thereby derive the multigigahertz frequency signal component having substantially said given amplitude and a resulting one of said +π/2 phase or, alternatively, said −π/2 phase as an output from said passive combiner;

whereby said given circuit constitutes a "NOR" MPL circuit.

12. The monolithic IC chip defined in claim 7, wherein said given circuit comprises:

first and second PHEMT FETs each of which has a source, drain and gate;

a passive combiner;

first means for applying said multigigahertz frequency signal component having substantially twice a given amplitude and a selected one of a +π/2 phase and a −π/2 phase through the drain-source path of said first PHEMT FET serially connected to the drain-source path of said second PHEMT FET as a first input to said passive combiner;

second means for applying a first binary logic signal to said gate of said first PHEMT FET for effectively rendering the relative value of a variable resistance value of said drain-source path thereof significantly large in response to said first binary logic signal having a first binary level representative of "0" and significantly small in response to said first binary logic signal having a second binary level representative of "1";

third means for applying a second binary logic signal to said gate of said second PHEMT FET for effectively rendering the relative value of a variable resistance value of said drain-source path thereof significantly large in response to said second binary logic signal having a first binary level representative of "0" and significantly small in response to said first binary logic signal having a second binary level representative of "1"; and fourth means for applying the multigigahertz frequency signal component having substantially said given amplitude and the non-selected one of a +π/2 phase and a −π/2 phase as a second input to said passive combiner to thereby derive the multigigahertz frequency signal component having substantially said given amplitude and a resulting one of said +π/2 phase or, alternatively, said −π/2 phase as an output from said passive combiner;

whereby said given circuit constitutes an "AND" MPL circuit.

13. The monolithic IC chip defined in claim 7, wherein said given circuit comprises:

first and second PHEMT FETs each of which has a source, drain and gate;

a given resistance having a given value;

first means for applying said multigigahertz frequency signal component having substantially twice a given amplitude and a selected one of a $+\pi/2$ phase and a $-\pi/2$ phase to a point of reference potential through said given resistance serially connected to the serially-connected drain-source paths of said first and second PHEMT FETs;

second means for applying a first binary logic signal to said gate of said first PHEMT FET for effectively rendering a variable resistance value of said drain-source path thereof significantly less than said given value of said given resistance in response to said first binary logic signal having a first binary level representative of "0" and significantly more than said given value of said given resistance in response to said first binary logic signal having a second binary level representative of "1";

third means for applying a second binary logic signal to said gate of said second PHEMT FET for effectively rendering a variable resistance value of said drain-source path thereof significantly less than said given value of said given resistance in response to said second binary logic signal having a first binary level representative of "0" and significantly more than said given value of said given resistance in response to said second binary logic signal having a second binary level representative of "1"; and fourth means including a passive combiner for combining an output at the junction of said given resistance and the serially-connected drain-source paths of said first and second PHEMT FETs with the multigigahertz frequency signal component having substantially said given amplitude and the non-selected one of a $+\pi/2$ phase and a $-\pi/2$ to thereby derive the multigigahertz frequency signal component having substantially said given amplitude and a resulting one of said $+\pi/2$ phase or, alternatively, said $-\pi/2$ phase as an output from said passive combiner.

14. The monolithic IC chip defined in claim 7, wherein said given circuit constitutes an unbalanced-to-balanced converter comprising:

a passive splitter for splitting an unbalanced multigigahertz frequency operating signal component having a selected one of a $+\pi/2$ phase and a $-\pi/2$ phase applied as an input thereto into first and second balanced multigigahertz frequency signals as respective outputs therefrom;

first and second sub-circuits, wherein said first sub-circuit includes a first PHEMT FET having a source, drain and gate with said first balanced multigigahertz frequency signal being applied to said gate thereof and the drain-source path thereof being energized by an operating signal from a +DC voltage source having a first internal resistance in series with the variable resistance of the drain-source path thereof, wherein said second sub-circuit includes a second PHEMT FET having a source, drain and gate with said second balanced multigigahertz frequency signal being applied to said gate thereof and the drain-source path thereof being energized by an operating signal from a –DC voltage source having a second internal resistance in series with the variable resistance of the drain-source path thereof, and wherein the respective amplitudes of said +DC and –DC voltages are sufficiently low to result in the maximum power dissipation by said given circuit being in the order of microwatts; and output means for deriving a first balanced output from said first sub-circuit at the junction of said +DC voltage source and said drain-source path of said first PHEMT FET and for deriving a second balanced output from said second sub-circuit at the junction of said –DC voltage source and said drain-source path of said second PHEMT FET.

15. The monolithic IC chip defined in claim 7, wherein said given circuit constitutes a balanced-to-unbalanced converter comprising:

first and second sub-circuits, wherein said first sub-circuit includes a first PHEMT FET having a source, drain and gate with a first balanced multigigahertz frequency input signal component having a selected one of a $+\pi/2$ phase and a $-\pi/2$ phase being applied to said gate thereof and the drain-source path thereof being energized by an operating signal from a +DC voltage source having a first internal resistance in series with the variable resistance of the drain-source path thereof, wherein said second sub-circuit includes a second PHEMT FET having a source, drain and gate with a second balanced multigigahertz frequency input signal component having the unselected one of a $-\pi/2$ phase and a $+\pi/2$ phase being applied to said gate thereof and the drain-source path thereof being energized by an operating signal from a –DC voltage source having a second internal resistance in series with the variable resistance of the drain-source path thereof, and wherein the respective amplitudes of said +DC and –DC voltages are sufficiently low to result in the maximum power dissipation by said given circuit being in the order of microwatts; and a passive combiner for combining a first balanced output from said first sub-circuit at the junction of said +DC voltage source and said drain-source path of said first PHEMT FET applied as a first input to said passive combiner and a second balanced output from said second sub-circuit at the junction of said -DC voltage source and said drain-source path of said second PHEMT FET applied as a second input to said passive combiner to thereby derive an unbalanced multigigahertz frequency output signal component having said selected one of said $+\pi/2$ phase and said 31 $\pi/2$ phase.

16. The monolithic IC chip defined in claim 7, wherein said given circuit comprises:

a PHEMT FET which has a source, drain and gate;

a given resistance having a given value;

first means for applying said multigigahertz frequency signal component representing a first MPL signal to a point of reference potential through said given resistance serially connected to an inductance serially connected to the drain-source path of said PHEMT FET;

second means for applying a control signal having a value to said gate of said PHEMT FET for controlling the effective value of a variable impedance of said drain-source path thereof in accordance with said control signal's value; and third means for deriving a second MPL signal as an output from said given circuit at the junction of said given resistance and said inductance serially connected to the drain-source path of said PHEMT drain-source path of said PHEMT FET.

\* \* \* \* \*